United States Patent
Bazarsky et al.

(10) Patent No.: US 11,522,563 B1
(45) Date of Patent: Dec. 6, 2022

(54) PROCESSOR INSTRUCTIONS FOR ITERATIVE DECODING OPERATIONS

(71) Applicant: Western Digital Technologies, Inc., San Jose, CA (US)

(72) Inventors: Alexander Bazarsky, Holon (IL); Ran Zamir, Ramat Gan (IL); Eran Sharon, Rishon Lezion (IL)

(73) Assignee: Western Digital Technologies, Inc., San Jose, CA (US)

( * ) Notice: Subject to any disclaimer, the term of this patent is extended or adjusted under 35 U.S.C. 154(b) by 0 days.

(21) Appl. No.: 17/500,653

(22) Filed: Oct. 13, 2021

(51) Int. Cl.
  *H03M 13/37* (2006.01)
  *G06F 11/10* (2006.01)
  *H03M 13/45* (2006.01)

(52) U.S. Cl.
  CPC ..... *H03M 13/3746* (2013.01); *G06F 11/1076* (2013.01); *H03M 13/45* (2013.01)

(58) Field of Classification Search
  CPC .............. H03M 13/3746; H03M 13/45; G06F 11/1076
  See application file for complete search history.

(56) References Cited

U.S. PATENT DOCUMENTS

| | | | |
|---|---|---|---|
| 7,308,567 B2 | 12/2007 | Yamamoto et al. | |
| 7,600,176 B2 | 10/2009 | Mead et al. | |
| 10,715,178 B2 | 7/2020 | Sharon et al. | |
| 2020/0021837 A1* | 1/2020 | Ikai | H04N 19/52 |
| 2021/0329251 A1* | 10/2021 | Chen | H04N 19/105 |

FOREIGN PATENT DOCUMENTS

CN   108563534 A   9/2018

OTHER PUBLICATIONS

Dörflinger et al., "ECC Memory for Fault Tolerant RISC-V Processors," International Conference on Architecture of Computing Systems, ARCS 2020: Architecture of Computing Systems—ARCS 2020, pp. 44-55.
Gottscho, et al., "Software-Defined Error-Correcting Codes," 2016 46th Annual IEEE/IFIP International Conference on Dependable Systems and Networks Workshops, pp. 276-282.

\* cited by examiner

*Primary Examiner* — Kyle Vallecillo
(74) *Attorney, Agent, or Firm* — Barry IP Law, P.C.

(57) ABSTRACT

A storage circuit is configured to store multiple vectors associated with variable and check nodes of an iterative decoding operation. As part of the iterative decoding operation, a processor circuit is configured to retrieve, from the storage circuit, an intermediate value vector, a first estimation vector, a second estimation vector, and a sign vector, and determine an absolute value of the intermediate value vector. The processor circuit is also configured, using the retrieved vectors, to generate updated values for the first and second estimation vectors as part of determining a bit estimate for a check node included in the iterative decoding operation.

13 Claims, 13 Drawing Sheets

PROCESSOR INSTRUCTIONS FOR ITERATIVE DECODING OPERATIONS

BACKGROUND

Technical Field

This disclosure relates to instruction processing in a computer system, and, in particular, to handling errors in instructions retrieved from memory.

Description of the Related Art

Computer systems can employ multiple processors or processor cores to perform various tasks by executing software or program instructions. Such software or program instructions may be written in a high-level computer language (e.g., C++) and then compiled into a set of instructions that can be performed by a processor or processor core. This set of instructions is referred to as a processor's "Instruction Set Architecture" (or "ISA"). During compilation of a software program or application for a particular processor, complex instructions written in the high-level computer language may be converted into a series of instructions included in the ISA of the particular processor.

To execute software or program instructions, processors or processor cores retrieve or "fetch" the compiled instructions from memory circuits, or other storage device (e.g., a solid-state disc drive), or over a network. In some cases, frequently used instructions may be stored in a cache memory to reduce the time needed to fetch such frequently used instructions.

Once an instruction has been fetched, a processor may begin a series of operations in order to execute the instruction. For example, upon receiving an instruction, a processor may perform a decode operation on the received instruction to determine if the instruction is a valid instruction in the ISA. Many processors employ multiple stages arranged in a pipelined fashion to sequentially perform the operations needed to execute a particular instruction. As the particular instruction moves through the different stages, each stage performs a different operation. Once the instruction has passed through all of the stages included in the pipeline, the instruction is completed by the processor.

SUMMARY

The present disclosure describes a technique for performing operations associated with an iterative decoding process. A storage circuit is disclosed that stores a plurality of vectors associated with an iterative decoding operation. A processor core retrieves a subset of the plurality of vectors from the storage circuit. The subset includes an intermediate value vector, a first estimation vector, a second estimation vector, and a sign vector. Upon receiving the subset of the plurality of vectors, the processor core determines an absolute value of the intermediate value vector, and generates an updated value for the first estimation vector using the absolute value of the intermediate value vector. The processor core additionally generates an updated value for the second estimation vector using the absolute value of the intermediate value vector, the updated value for the first estimation vector, and a current value of the second estimation vector. The processor core further generates an updated value for the sign vector using a current value of the sign vector and a sign of the intermediate value vector.

DETAILED DESCRIPTION

Figure 1:
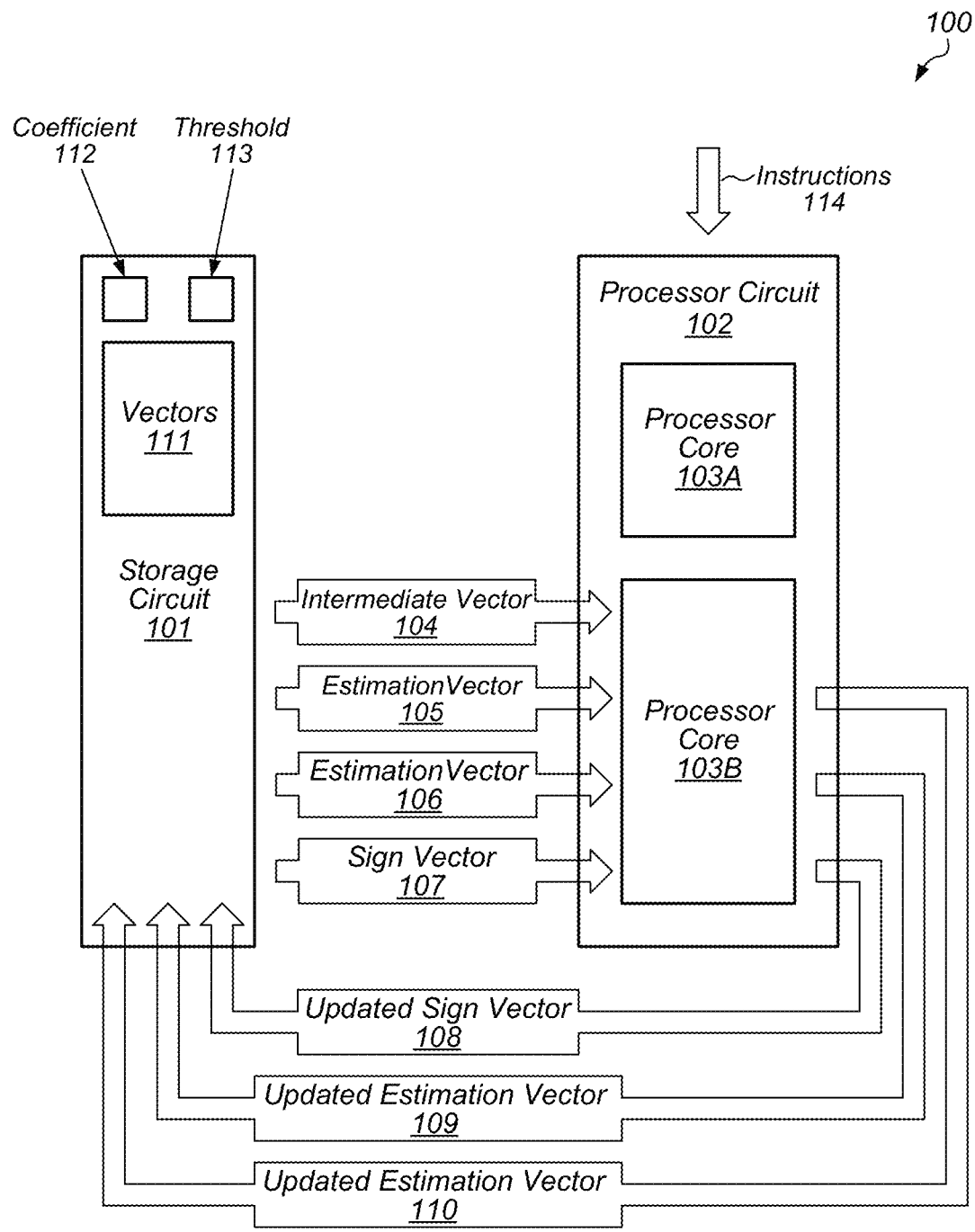
FIG. 1 is a block diagram of an embodiment of a processor circuit coupled to a storage circuit.

Some memory circuits store information as charge in a storage cell. When a storage cells is accessed or "read," the charge stored in the storage cell is translated to a voltage level, which is interpreted as a particular logic value. Differences in the electrical properties between different storage cells can result in different voltage levels for the same logic value. As a result, a voltage level generated by a storage cell is used in conjunction with reliability information on the stored data to determine a logic value corresponding to the voltage level.

One technique for determining a logic value for a voltage level generated by a storage cell involves the use of a soft-decoding algorithm. Such an algorithm includes an iterative message-passing decoding process where a metric is passed between nodes where corresponding values of the metric are updated. One metric often used in soft-decoding of storage cell values is a log-likelihood ratio ("LLR") associated with the voltage level read from a storage cell. As depicted in Equation 1, the LLR for a given bit b as a function of read voltage V is given by the logarithm of the ratio of the probability that the bit value is a logical-0 to the probability that the bit value is a logical-1.

$$LLR_b(V) = \log \frac{Pr(b=0\mid V)}{Pr(b=1\mid V)} \quad (1)$$

A LLR value can be a value between negative infinity and positive infinity, where the sign of the value corresponds to an estimate of the bit value, while the magnitude of the LLR corresponds to a reliability of the bit estimate. It is noted that a LLR is one possible metric that can be used in a soft-decoding algorithm and soft-decoding algorithms may employ different metrics.

During execution of the soft-decoding algorithm, variable nodes in a decoder are initialized with LLR bit estimates based on voltages read from storage cells in a memory circuit. In an iterative process, each check node of the decoder is serially traversed where the bit estimates are updated. The process continues until parity checks have been satisfied, at which point bit values have been determined based on the voltages read from the storage cells.

A variable node within the decoder performs simple addition operations. Check nodes, however, need to perform more complex operations to determine bit estimates. An example of the computation of a bit estimate $R_{cv}$ at a check node is depicted in Equation 2, where $Q_{vc}$ is a bit estimate from a variable node. As shown in Equation 2, to determine a bit estimate includes the calculation of hyperbolic tangent, making the computation of the bit estimate challenging.

$$R_{cv} = \varphi^{-1}\left(\sum_{v' \in N(c)\backslash v} \varphi(Q_{v'c})\right), \text{ where } \varphi(x) = \left\{\text{sign}(x), -\log \tanh\left(\frac{|x|}{2}\right)\right\} \quad (2)$$

The calculation of a bit estimate can be simplified by taking the value of $Q_{vc}$ with the lowest magnitude and a sign that is the product of the $Q_{vc}$ signs. An example of the simplification is depicted in Equation 3. This simplification is referred to as the min-sum algorithm. In some cases, the number of $Q_{vc}$ messages may be in the order of a few dozens, allowing for a further simplification by accumulating $Q_{vc}$ messages one at a time in what is referred to as a soft_xor operation.

$$R_{cv} = s \cdot \min |Q_{v'c}| \text{ for } v' \in N(c)\backslash v, \text{ where } s = \prod_{v' \in N(c)\backslash v} \text{sign } Q_{v'c} \quad (3)$$

In some computer systems, soft-decoding algorithms are implemented as dedicated circuits that may include both sequential logic circuits and combinatorial logic circuits to implement the variable and check nodes needed to perform a soft-decoding algorithm. Such dedicated circuits receive a voltage level from a storage cell along with additional information and perform an iterative decoding operation to refine a LLR value for the voltage level. Upon completion of the decoding operation, a logic value is determined based on the LLR value.

In some cases, even with the min-sum simplification, the iterative decoding operation may be too complex for a dedicated circuit, resulting in an incorrect LLR value or an error. Alternatively, or additionally, the dedicated circuit may be too costly in terms of power and area consumption for some applications. In such cases, the iterative decoding process may be performed by a general-purpose processor or processor core configured to execute a software or application program. In such cases, the variable and check nodes exist as virtual entities, with the value that they generate being determined by the general-purpose processor or processor core executing the software or application program.

When the iterative decoding operation is implemented using a general-purpose processor or processor core, many software instructions may be repeatedly fetched and executed to implement repeated tasks included in the iterative decoding operation. Such repeated fetching and execution can increase power consumption as well as limit the performance of the general-purpose processor or processor core. The embodiments illustrated in the drawings and described below may provide techniques for implementing an iterative decoding operation on a general-purpose processor or processor core with a modified instruction set architecture that includes instructions which can replace multiple software instructions associated with repeated tasks in the iterative decoding operation. By employing such a modified instruction set architecture, software can be simplified, thereby reducing power consumption and improving performance.

Turning now to FIG. 1, a block diagram of a computer system is depicted. As illustrated, computer system 100 includes storage circuit 101, and processor circuit 102, which includes processor cores 103A and 103B. It is noted that although processor circuit 102 is depicted as including two processor cores, in other embodiments, any suitable number of processor cores may be employed.

Storage circuit 101 is configured to store vectors 111. In various embodiments, vectors 111 may be associated with an iterative decoding process such as described above. The number of vectors included in vectors 111 may be based on a number of nodes included in the iterative decoding process, such as bit estimates from parity check nodes and bit estimates from variable nodes. Any of vectors 111 may include N bits arranged in corresponding ordered bit positions, where N is a positive integer.

Processor core 103A is configured to retrieve, from storage circuit 101, a subset of vectors 111 that includes intermediate vector 104, estimation vector 105, estimation vector 106, and sign vector 107. Processor core 103A is further configured to determine an absolute value of intermediate vector 104, and generate updated estimation vector 109 using the absolute value of intermediate vector 104. Processor core 103A is also configured to generate updated estimation vector 110 using the absolute value of intermediate vector 104, updated estimation vector 109, and estimation vector 106. Additionally, processor core 103A is further configured to generate updated sign vector 108 using sign vector 107 and a sign of intermediate vector 104.

In some embodiments, processor core 103A may be configured to perform a combination of the operations described above in response to receiving a soft_xor command. Pseudo code for the soft_xor command is depicted in Example 1, where Qvc corresponds to intermediate vector 104, Min1 corresponds to estimation vector 105, Min2 corresponds to estimation vector 106, and S corresponds to sign vector 107. As shown in Example 1, the soft_xor command combines the above-described operations as a multi-cycle set of operations that can be activated by the execution of a single instruction instead of multiple instructions, thereby improving performance and reducing power consumption by saving instruction fetch operations. It is noted that in various embodiments, the two logical expressions (e.g., if |Qvc|<Min 1) may be executed in parallel, or may be combined into a single logical expression.

EXAMPLE 1: Soft_Xor Pseudo Code
If |Qvc|<Min1 then
   Min1=|Qvc|
else
   Min1=Min1
If |Qvc|<Min1 then
   Min2=Min1
elseif |Qvc|<Min2 then
   Min2=|Qvc|
else
   Min2=Min2
S=S*sign(Qvc)

While the soft_xor command can reduce the complexity of a software program or application designed to perform an iterative decoding process, additional commands are also possible and contemplated. Such commands may include correction commands that apply a correction to the results of the soft_xor command, thereby improving performance of the soft_xor command. The correction commands may include two types of correction that can be used to modify the results of the soft_xor command.

One type of correction command is an additive correction command. Pseudo code for an additive correction command is depicted in Example 2, where Min corresponds to estimation either of estimation vector 105 or estimation vector 106, S corresponds to sign vector 107, and alpha is a coefficient based on node relationships that stem from the code matrix.

EXAMPLE 2: Additive Correction Pseudo Code
If |Qvc|<Min then
    Min=|Qvc|-alpha ||Qvc|-Min|
else
    Min=Min-alpha ||Qvc|-Min|
S=S*sign(Qvc)

In response to receiving an additive correction command, which may be included in instructions 114, processor core 103A is further configured to determine a difference between estimation vector 105 and the updated estimation vector 109, and to determine a product of the difference and coefficient 112. Processor core 103A is also configured to generate a corrected value for estimation vector 105 using the updated value of estimation vector 105 and the product. It is noted that while the above description is described in terms of estimation vector 105, in various embodiments, the additive correction command may be applied to estimation vector 106 as well.

The correction commands may also include a multiplicative correction command. Pseudo code for a multiplication correction command is depicted in Example 3, where Min corresponds to estimation either of estimation vector 105 or estimation vector 106, S corresponds to sign vector 107, and alpha corresponds to coefficient 112 and is based on node relationships that stem from the code matrix.

EXAMPLE 3: Multiplicative Correction Pseudo Code
If |Qvc|<Min then
    Min=alpha*(|Qvc )
else
    Min=alpha*(Min)
S=S*sign(Qvc)

In response to receiving an additive correction command, which may be included in instructions 114, processor core 103A is further configured to generate a corrected value for estimation vector 105 using coefficient 112 and updated estimation vector 109. It is noted that coefficient 112 may be stored in storage circuit 101 or any other suitable storage location. In various embodiments, processor core 103A is further configured to multiply coefficient 112 and updated estimation vector 109 to generate the corrected value for estimation vector 105. It is noted that while the above description is described in terms of estimation vector 105 in various embodiments, the additive correction command may be applied to estimation vector 106 as well.

In various embodiments, the operations associated with the soft_xor and the additive and multiplicative correction command, are performed on fixed point, e.g., estimation vector 105 is a fixed-point number. As such, it is important that no overflows are encountered during the iterative decoding process. To limit the possibility of overflow, processor core 103A is further configured to perform a saturation check operation. To perform the saturation check operation, processor core 103A is further configured to perform a comparison of updated estimation vector 109 to threshold 113, and adjust updated estimation vector 109 using the result of the comparison. In various embodiments, threshold 113 may be stored in storage circuit 101 or any other suitable storage location.

In some embodiments, to adjust updated estimation vector 109, processor core 103A is further configured to set a value of updated estimation vector 109 to threshold 113. It is noted that the saturation operation may be applied to any of updated sign vector 108, updated estimation vector 109, and updated estimation vector 110. In some cases, the saturation check operation may be concatenated with the soft_xor command to prevent additional instruction fetches.

Figure 2:
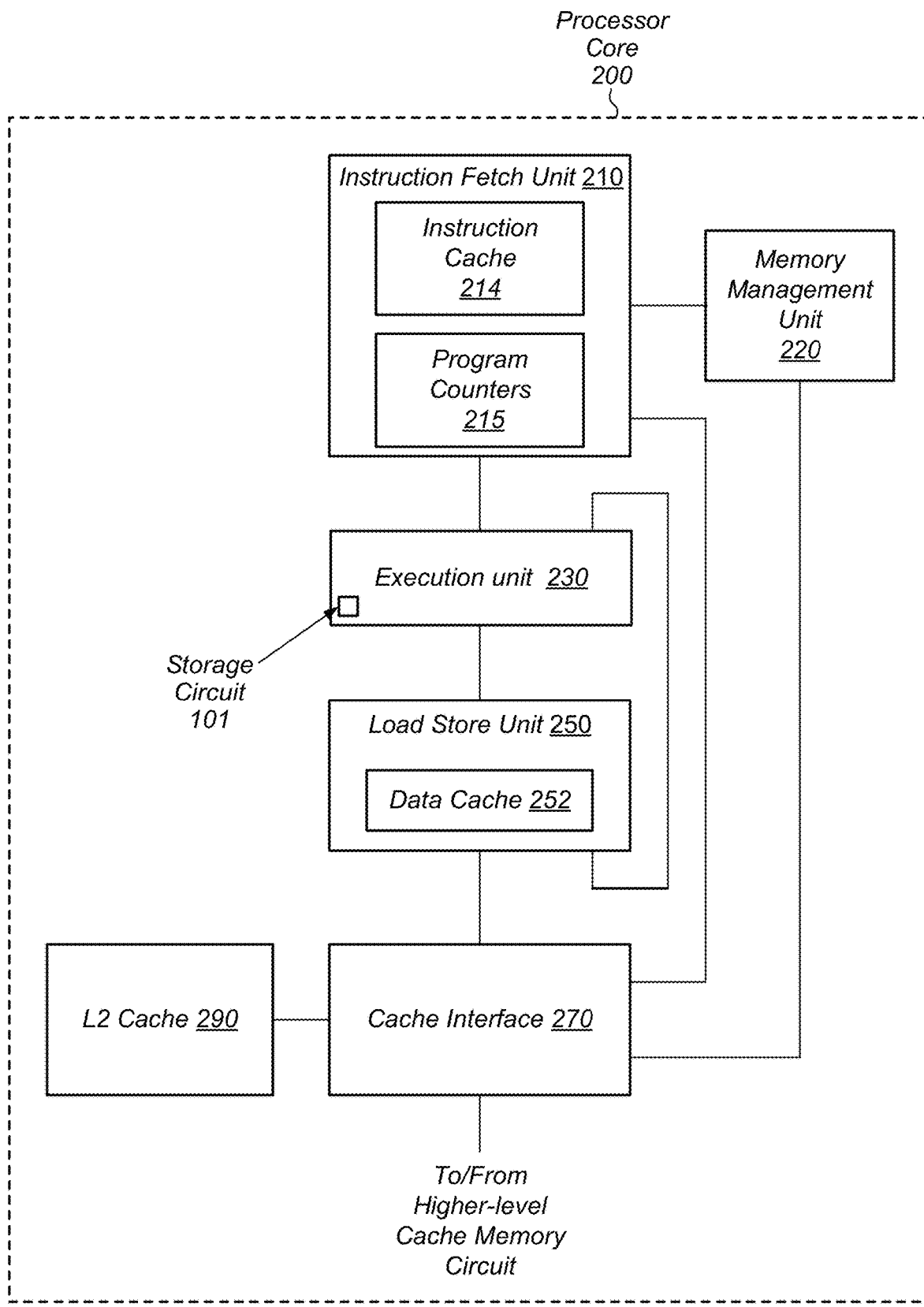
FIG. 2 is a block diagram of one embodiment of a processor core.

Turning to FIG. 2, a block diagram of a processor core is depicted. As illustrated, processor core 200 includes instruction fetch unit 210, memory management unit 220, execution unit 230, load store unit 250, cache interface 270, and L2 cache 290. In various embodiments, processor core 200 may correspond to either of processor cores 103A or 103B.

Instruction fetch unit 210 is coupled to memory management unit 220 and cache interface 270. In various embodiments, instruction fetch unit 210 is configured to perform various operations relating to the fetching of instructions from a cache or memory circuit, the selection of instructions from various threads of execution, and the decoding of such instructions prior to issuing the instructions to various functional units for execution. As illustrated, instruction fetch unit 210 includes instruction cache 214 and program counter 215.

In some embodiments, program counter 215 is configured to generate multiple values corresponding to addresses of instructions to be fetched for respective threads being executed by processor core 200. Program counters 215 may be implemented using one or more sequential logic circuits configured to generate such address values.

Memory management unit 220 is configured to relay requests and responses from instruction fetch unit 210 and cache interface 270 to and from system memory. In various embodiments, memory management unit 220 may be further configured to perform address translation from a virtual address space used by processor core 200 to a physical address space used by system memory. Memory management unit 220 may, in other embodiments, be configured to translated requests from an internal format used within processor core 200 to a format compatible with system memory. In a similar fashion, memory management unit 220 may be further configured to translate replies from system memory into a format compatible with processor core 200. In various embodiments, memory management unit 220 may be implemented using a state machine or other sequential logic circuit, a microcontroller, or any other suitable logic circuit.

Execution unit 230 is configured to execute and provide results for certain types of instructions issued from instruction fetch unit 210. In some embodiments, execution unit(s) 230 may be configured to execute certain integer-type instructions defined in the implemented instruction set architecture including the soft_xor command described above. It is noted that although only a single execution unit is depicted in the embodiment of FIG. 2, in other embodiments, multiple execution units may be employed.

As illustrated, execution unit 230 includes storage circuit 101. In various embodiments, information indicative of vectors 104-107 may be stored in storage circuit 101 prior to execution unit 230 executing a soft_xor or vector shift command. It is noted that although storage circuit 101 is depicted as being included in execution unit 230, in other embodiments, storage circuit 101 may be external to execution unit 230 or external to processor core 200, and may be located at any suitable location in the hierarchy of a storage controller or computer system.

Load store unit 250 is configured to process data memory references, such as integer and floating-point load and store instructions. In some embodiments, load store unit 250 may be further configured to assist in the processing of instruction cache 214 misses originating from instruction fetch unit 210. As illustrated, load store unit 250 includes data cache 252 in addition to a logic circuit configured to detect cache misses and, in response to such misses, request data from L2 cache 290 or a higher-level cache memory via cache interface 270.

In various embodiments, data cache 252 may be implemented as a write-through cache, in which all writes (or "stores") to data cache 252 are written to a higher-level cache memory regardless of whether the stores hit in data cache 252. In some cases, writes that miss in data cache 252 can result in an allocation within data cache 252 that can be used for storing the data. Data cache 252 may, in various embodiments, be implemented as a static random-access memory (SRAM) circuit or other suitable memory circuit.

L2 cache 290 is configured to store (or "cache") frequently used instructions and data for use by execution unit 230. In various embodiments, L2 cache 290 may be implemented using multiple banks that can be independently accessed using corresponding addresses. Such banks may be implemented using set-associative or direct-mapped techniques. In some embodiments, L2 cache 290, including any banks, may be implemented as SRAM circuits or any other suitable memory circuits.

Cache interface 270 is configured to relay data requests from data cache 252 and L2 cache 290 to higher-level cache memory circuits. In response to a determination that requested data is unavailable from the higher-level cache memory circuits, cache interface 270 may relay the data request to memory management unit 220 for transmission to system memory or other storage. Cache interface 270 may, in various embodiments, be implemented using a state machine or other sequential logic circuit, a microcontroller, or any other suitable logic circuit.

Figure 3:
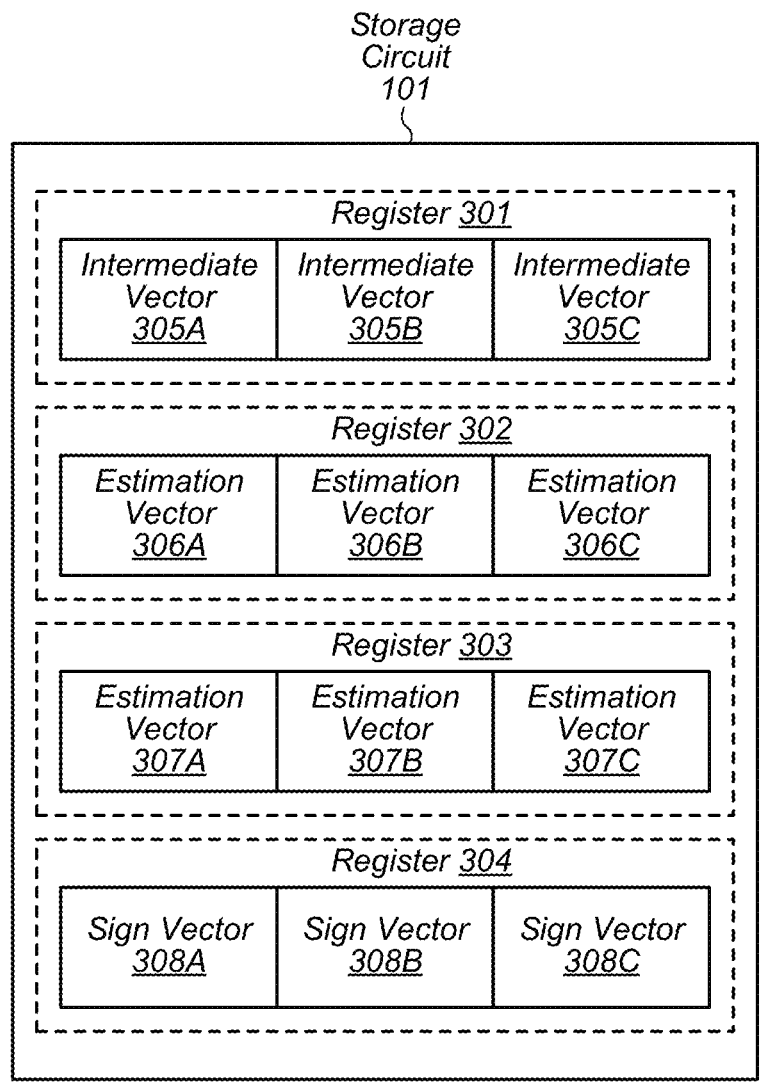
FIG. 3 is a block diagram of an embodiment of a storage circuit.

Turning to FIG. 3, an embodiment of storage circuit 101 is depicted. As illustrated, storage circuit 101 includes registers 301-304. It is noted that although only four registers are depicted in the embodiment of FIG. 3, in other embodiments, any suitable number of registers may be employed.

Register 301 is configured to store intermediate vectors 305A-305C. In various embodiments, intermediate vectors 305A-305C may include information indicative of intermediate results of corresponding nodes of an iterative decoding process being performed on a given bit. The information may, in some embodiments, include a log-likelihood ratio value associated with the given bit. Although register 301 is depicted as storing only three intermediate vectors, in other embodiments, register 301 may be configured to store any suitable number of intermediate vectors.

Registers 302 and 303 are configured to store estimation vectors 306A-306C and 307A-307C, respectively. In various embodiments, estimation vectors 306A-306C and 307A-307C may include data indicative of estimates of the value of the given bit. In some cases, the data may encode a log-likelihood ratio associated with the given bit. Although registers 302 and 303 are depicted as each storing only three estimation vectors, in other embodiments, registers 302 and 303 may be configured to store any suitable number of estimation vectors.

Register 304 is configured to store sign vectors 308A-308C. In various embodiments, sign vectors 308A-308C may include information indicative of a sign of a corresponding one of intermediate vectors 305A-305C. Although register 304 is depicted as storing only three sign vectors, in other embodiments, register 304 may be configured to store any suitable number of sign vectors.

Each of registers 301-304 can include multiple storage circuits configured to store corresponding bits. Such storage circuits may be implemented using latch circuit, flip-flop circuits, or any other circuit configured to store information indicative of a bit. In various embodiments, portions of any of registers 301-304 may be accessed independently. For example, intermediate vector 305A and 305C may be accessed in register 301 without accessing intermediate vector 305B.

It is noted that although storage circuit 101 is depicted as including multiple registers, in other embodiments, storage circuit 101 may be implemented as a memory circuit that does not include registers. In such cases, the locations of individual vectors may be mapped to specific addresses with an address space of the memory circuit.

Figure 4:
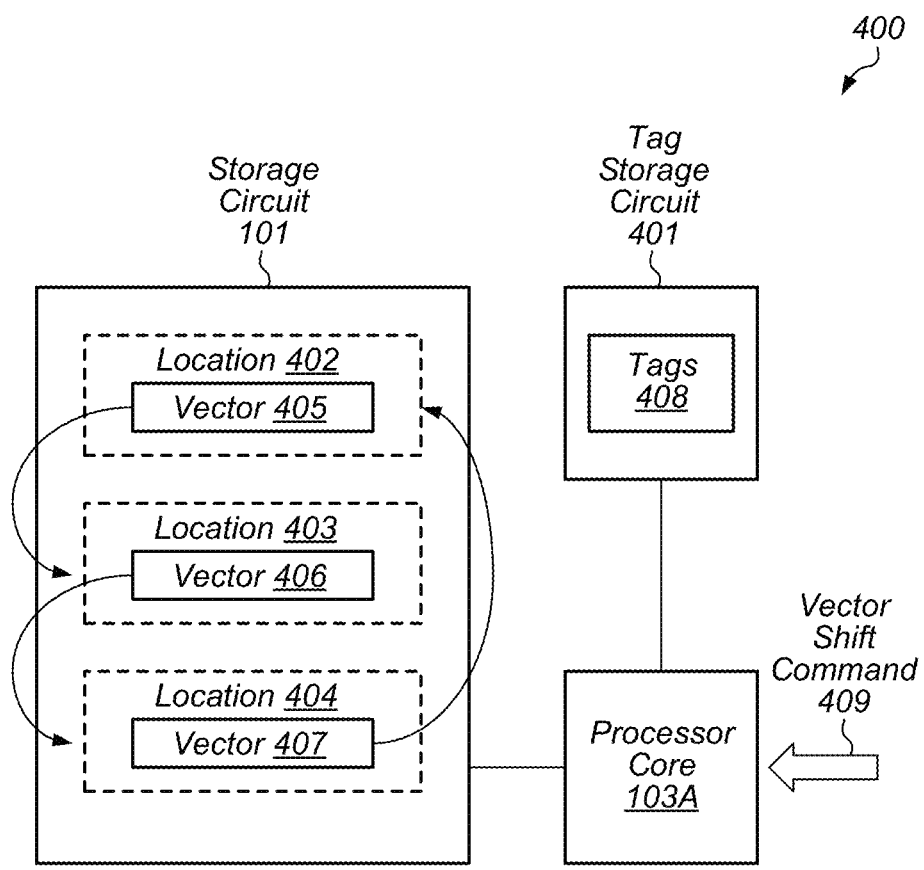
FIG. 4 is a block diagram of one embodiment of a processor core coupled to a storage circuit and a tag storage circuit.

Turning to FIG. 4, a block diagram of an embodiment of a system that includes processor core coupled to a storage circuit and a tag storage circuit is depicted. As illustrated, system 400 includes storage circuit 101, processor core 103A, and tag storage circuit 401.

Storage circuit 101 is configured to store vectors 405-407 at locations 402-404, respectively. Each of locations 402-404 may be specified by corresponding one of tags 408 stored in tag storage circuit 401. In various embodiments, vectors 405-407 may correspond to any of the vectors associated with an iterative decoding process as depicted in FIG. 3. It is noted that although only three vectors are depicted in the embodiment of FIG. 4, in other embodiments, any suitable number of vectors may be stored in corresponding locations within storage circuit 101.

As described above, processor core 103A may be configured to shift vectors, such as vectors 405-407, prior to performing operations to update the values of the vectors. For example, processor core 103A is configured, in response to receiving vector shift command 409, to change the storage locations of vectors 405-407 within storage circuit 101. As illustrated, processor core 103A is configured to move vector 405 from location 402 to location 403, move vector 406 from location 403 to 404, and move vector 407 from location 404 to location 402, essentially performing a shift operation. It is noted that while a shift of a single position is depicted in the embodiment of FIG. 4, in other embodiments, a shift of more than a single position is possible, and the number of shift positions may be specified in vector shift command 409.

To move individual vectors within storage circuit 101, processor core 103A may be further configured to retrieve a particular vector from storage circuit 101, and re-write the particular vector to a different location within storage circuit 101. Alternatively, processor core 103A may be configured to modify tags 408, which encode the storage locations for vectors 405-407. By modifying tags 408, the information specifying the storage locations for vectors 405-407 within storage circuit 101 may be changed, which has the effect of moving vectors 405-407 within the address space of storage circuit 101, without actually having to move the data for vectors 405-407.

Both storage circuit 101 and tag storage circuit 401 may be implemented as SRAMs, register files, or any other suitable storage circuits. It is noted that although only a single processor core is depicted in the embodiment of FIG. 4, in other embodiments, additional processor cores may be coupled to storage circuit 101 and tag storage circuit 401.

Figure 5:
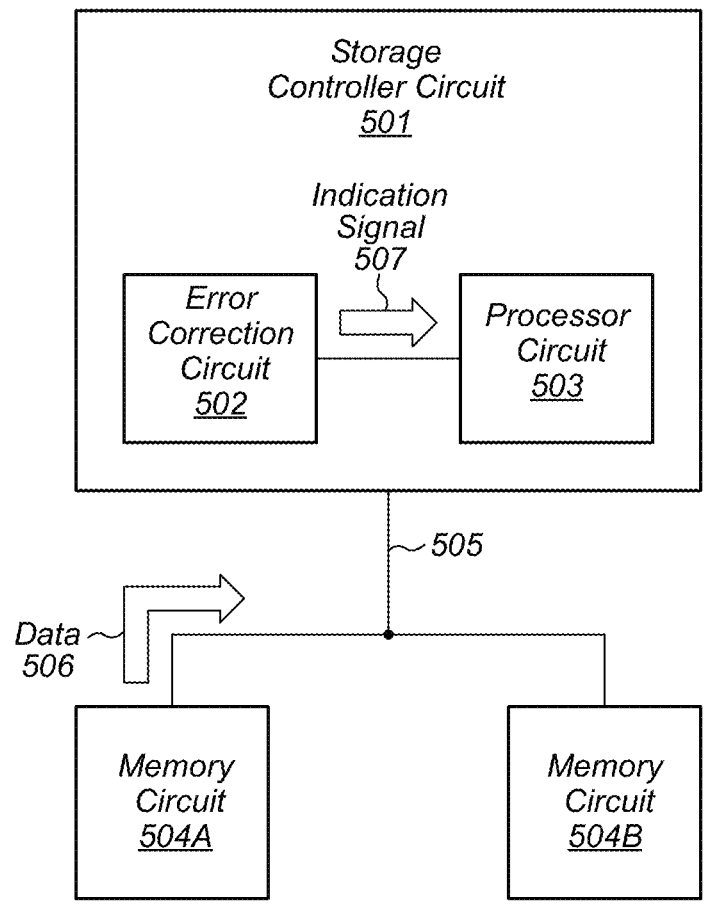
FIG. 5 is a block diagram of an embodiment of a storage controller circuit coupled to memory circuits.

Turning to FIG. 5, a block diagram of a storage system is depicted. As illustrated, storage system 500 includes storage controller circuit 501 and memory circuits 504A and 504B. Storage controller circuit 501 includes error correction circuit 502 and processor circuit 503. It is noted that, in various embodiments, processor circuit 503 may correspond to processor circuit 102 as depicted in FIG. 1.

Memory circuits 504A and 504B are coupled to communication bus 505. In various embodiments, memory circuit 504A is configured to send data 506 to storage controller circuit 501 via communication bus 505. It is noted that communication bus 505 may be a serial or parallel interface and may employ a particular one of various communication protocols, such as the common flash memory interface or any other suitable interface standard.

In various embodiments, memory circuits 504A and 504B may be implemented using either volatile or non-volatile storage cells. For example, in some embodiments, memory circuits 504A and 504B may be implemented as flash memory circuits, magnetic random-access memory (MRAM) circuits, spin transfer torque random-access memory (STT-RAM) circuits, ferroelectric random-access memory (FeRAM) circuits, or resistive random-access memory (RRAM) circuits, while in other embodiments, memory circuits 504A and 504B may be implemented as dynamic random-access memory (DRAM) circuits. Although only two memory circuits are depicted in the embodiment of FIG. 5, in other embodiments, any suitable number of memory circuits may be employed.

Error correction circuit 502 is configured to receive data 506 from memory circuit 504A via communication bus 505. In various embodiments, data 506 may be indicative of value of a given bit of multiple bits stored in memory circuit 504A. In some cases, data 506 may include information indicative of a log-likelihood ratio associated with the given bit.

Error correction circuit 502 is configured to analyze data 506. To analyze data 506, error correction circuit 502 may be further configured to perform an initial number of iterations of an iterative decoding operation. Error correction circuit 502 may be further configured, based on intermediate results of the initial number of iterations, to determine if it is capable of completing the iterative decoding process. In some embodiments, error correction circuit 502 is further configured to perform an analysis of data 506, and to transfer data 506 to processor circuit 503 based on results of the analysis.

In various embodiments, to perform the analysis of data 506, error correction circuit 502 may be further configured to perform an initial number of decoding iterations of an iterative decoding operation. Error correction circuit 502 may also be configured to transfer data 506 to processor circuit 503 based on intermediate results generated by the initial number of decoding iterations. In other embodiments, error correction circuit 502 may be further configured to transfer the intermediate results to processor circuit 503 in addition to the data 506.

In various embodiments, error correction circuit 502 may include storage circuits (not shown) and may be implemented as a sequential logic circuit, microcontroller, or any other suitable circuit.

Processor circuit 503 is configured to perform an iterative decoding operation using data 506 to determine a final value for the given bit. In some embodiments, processor circuit 503 may also be configured to determine the final value for the given bit using data 506 along with intermediate decoding results generated by error correction circuit 502. In various embodiments, processor circuit 503 may correspond to either processor core 103A or processor core 103B as depicted in the embodiment of FIG. 1.

Figure 6:
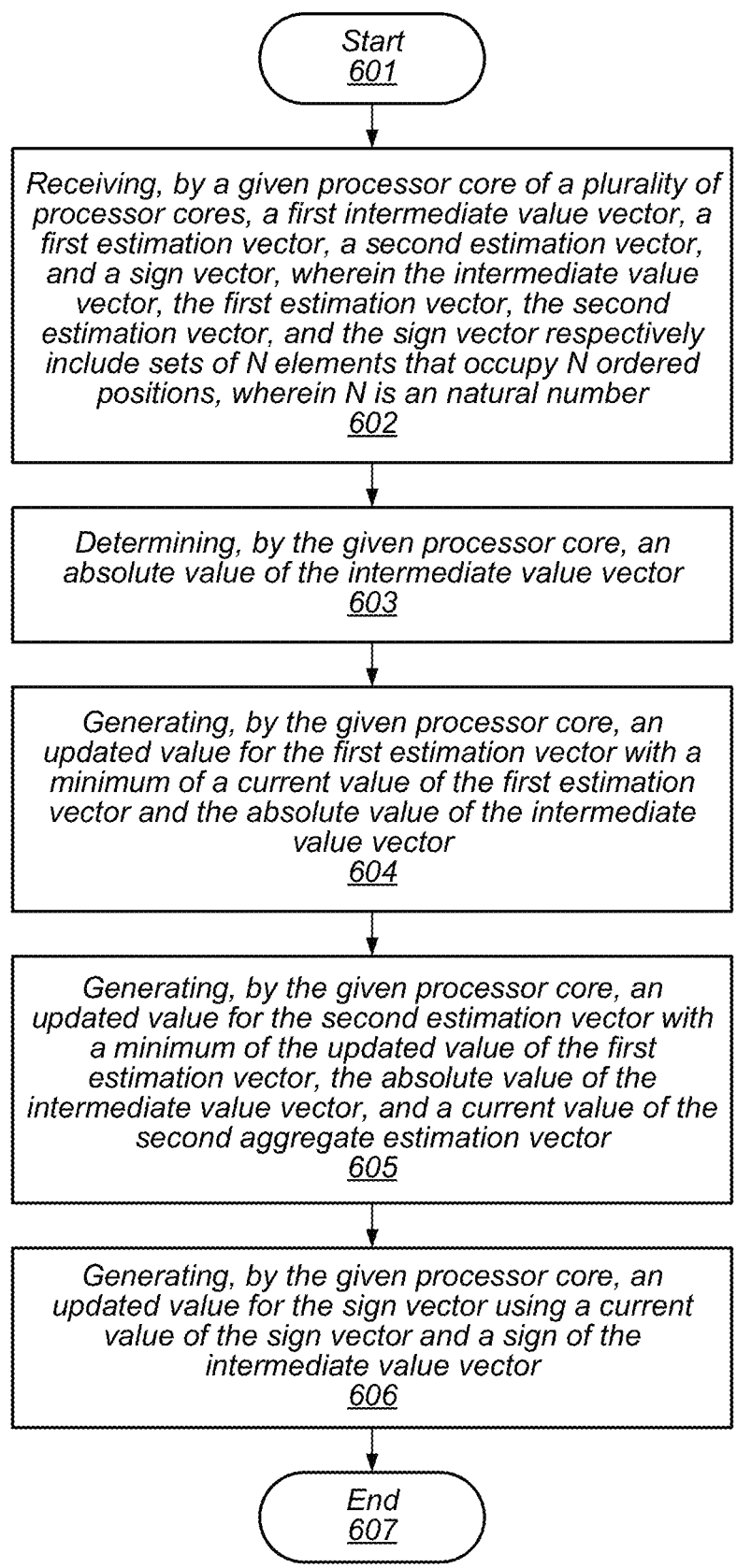
FIG. 6 is a flow diagram depicting an embodiment of a method for performing an operation associated with an iterative decoding process.

Turning to FIG. 6, a flow diagram depicting an embodiment of a method for performing an operation associated with an iterative decoding process is illustrated. The method, which may be applied to various processor circuits (e.g., processor circuit 102), begins in block 601.

The method includes receiving, by a given processor core of a plurality of processor cores, a first intermediate value vector, a first estimation vector, a second estimation vector, and a sign vector (block 602). In various embodiments, each of the first intermediate value vector, the first estimation vector, the second estimation vector, and the sign vector may include respective sets of N bits, arranged in N ordered bit positions, where N is a natural number. The method also includes determining, by the given processor core, an absolute value of the first intermediate value vector (block 603).

The method further includes generating, by the given processor core, an updated value for the first estimation vector using a minimum of a current value of the first estimation vector and the minimum of the first intermediate value vector (block 604). In some embodiments, generating the updated value for the first estimation vector includes determining a difference between the absolute value of the first intermediate value vector and the updated value for the first estimation vector, determining a product of the difference and a coefficient, and generating a corrected value for the first estimation vector using the updated value of the first estimation vector and the product. In various embodiments, the method may further include generating, by the given processor core, the corrected valued for the first estimation vector using a coefficient and the updated value of the first estimation vector.

The method may, in some embodiments, also include performing, by the given processor core, a comparison of the updated value for the first estimation vector to a threshold value, and adjusting, by the given processor core, the updated value for the first estimation vector using results of the comparison. In some embodiments, adjusting the updated value for the first estimation vector may include selecting a minimum value of the updated value for the first estimation vector and the threshold value.

The method also includes generating, by the given processor core, an updated value for the second estimation vector using a minimum of the updated value of the first estimation vector, the absolute value of the first intermediate value vector, and a current value of the second estimation vector (block 605).

The method further includes generating, by the given processor core, an updated value for the sign vector using a current value of the sign vector and a sign of the first intermediate value vector (block 606).

In some embodiments, the first intermediate value vector is included in a plurality of intermediate value vectors stored in corresponding ones of a plurality of registers. In such cases, the method may further include changing respective registers in which the plurality of intermediate value vectors are stored, and retrieving, by the given processor cores, the first intermediate value vector from its new storage location prior to a determination of the absolute value of the first intermediate value vector.

In other embodiments, the method may further include receiving a second intermediate value vector, a third estimation vector, a fourth estimation vector, and a second sign vector. In such cases, the method may also include determining an absolute value for the second intermediate value vector, and generating, in parallel to generating the updated value for the first estimation vector, an updated value for the third estimation vector using a minimum of a current value of the third estimation vector and the absolute value of the second intermediate value vector. The method concludes in block 607.

Figure 7:
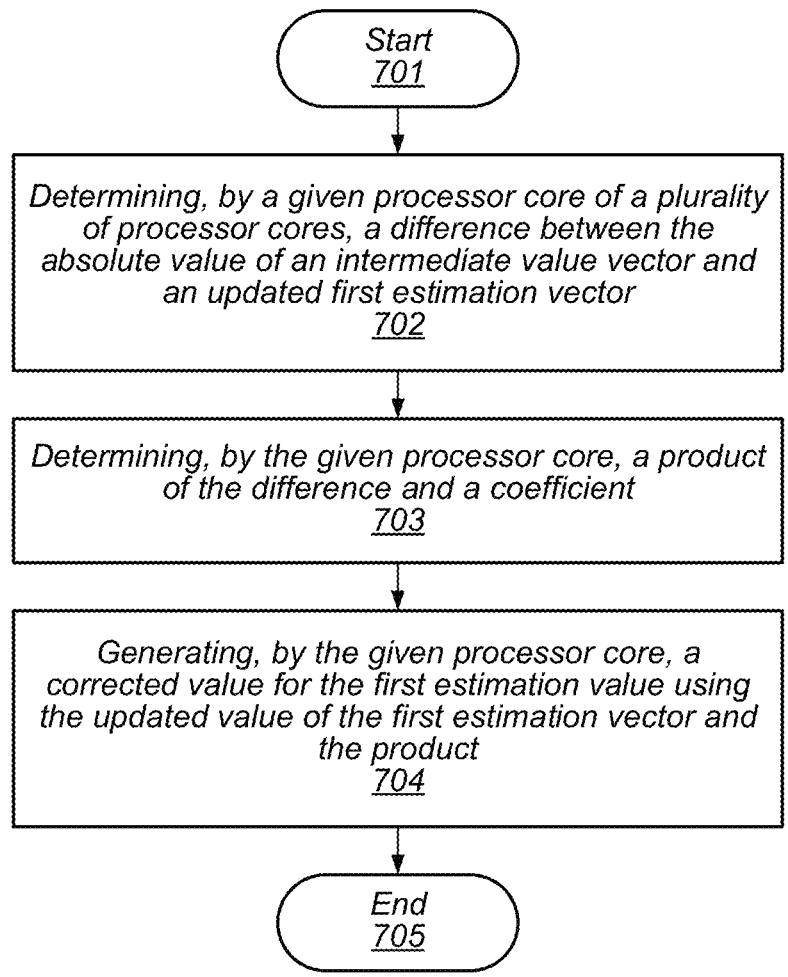
FIG. 7 is a flow diagram of an embodiment of a method for performing an additive correction operation.

In some iterative decoding applications, adjusting a determined intermediate value at one of the decoding nodes may improve the performance of the decoding process by reducing a number of iterations. A flow diagram depicting an embodiment of a method for performing one such adjustment is depicted in FIG. 7. The method, which may be applied to various processor circuits, such as processor circuit 102, begins in block 701. It is noted that the method depicted in the flow diagram of FIG. 7 may be used in conjunction with the method depicted in the flow diagram of FIG. 6.

The method includes determining, by a given processor core, a difference between an absolute value of an intermediate value vector and an updated value of a first estimation vector (block 702). In various embodiments, the intermediate value vector and the first estimation vector may be associated with a particular decoding node included in an iterative decoding process. In various embodiments, the method may further include storing, by the given processor core, the difference in a temporary register.

The method further includes determining, by the given processor core, a product of the difference and a coefficient (block 703). In various embodiments, the method may further include retrieving the difference from the temporary register and retrieving the coefficient from a storage location. In some embodiments, the storage location may be a particular register in a register file, a main memory circuit, or any other suitable storage location. It is noted that a value of the coefficient may be based on a type of the iterative decoding process.

The method further includes generating, by the given processor core, a corrected value for the first estimation vector using the updated value of the first estimation vector (block 704). In various embodiments, the method may also include storing the corrected value for the first estimation vector in a register that originally stored the updated value of the first estimation vector. The method concludes in block 705.

Figure 8:
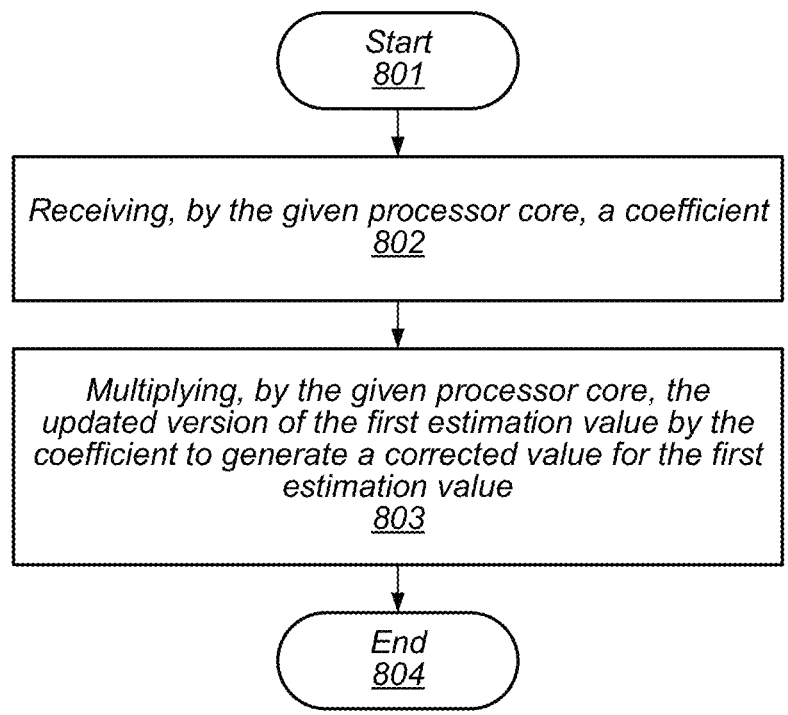
FIG. 8 is a flow diagram of an embodiment of a method for performing a multiplicative correction operation.

Another adjustment that may be employed when performing an iterative decoding operation is a multiplicative correction. A flow diagram depicting an embodiment of a method for performing a multiplicative correction is illustrated in FIG. 8. The method, which may be applied to various processor circuits (e.g., processor circuit 102), begins in block 801.

The method includes receiving, by a given processor core of a plurality of processor cores, a coefficient (block 802). In various embodiments, the method may include retrieving the coefficient from a storage location, such as a particular register of a register file, a memory circuit, and the like. It is noted that the coefficient may, in various embodiments, be based on characteristics of the given processor core or characteristics of an algorithm used by the given processor core to perform the iterative decoding operation.

The method further includes multiplying, by the given processor core, an updated version of a first estimation vector by the coefficient to generate a corrected value for the first estimation vector (block 803). In various embodiments, the method may further include storing the corrected value by overwriting the updated version of the first estimation vector in the same storage location. The method concludes in block 804.

In some cases, information to be processed by a particular node in an iterative decoding operation may need to be routed to a different node. Such re-routing can involve retrieving the information and temporarily storing the retrieved information prior to re-storing the information in new locations from which the different node retrieves its information. The process of retrieving and re-storing data may include the execution of additional software or program commands, thereby reducing the performance of the iterative decoding operation.

Figure 9:
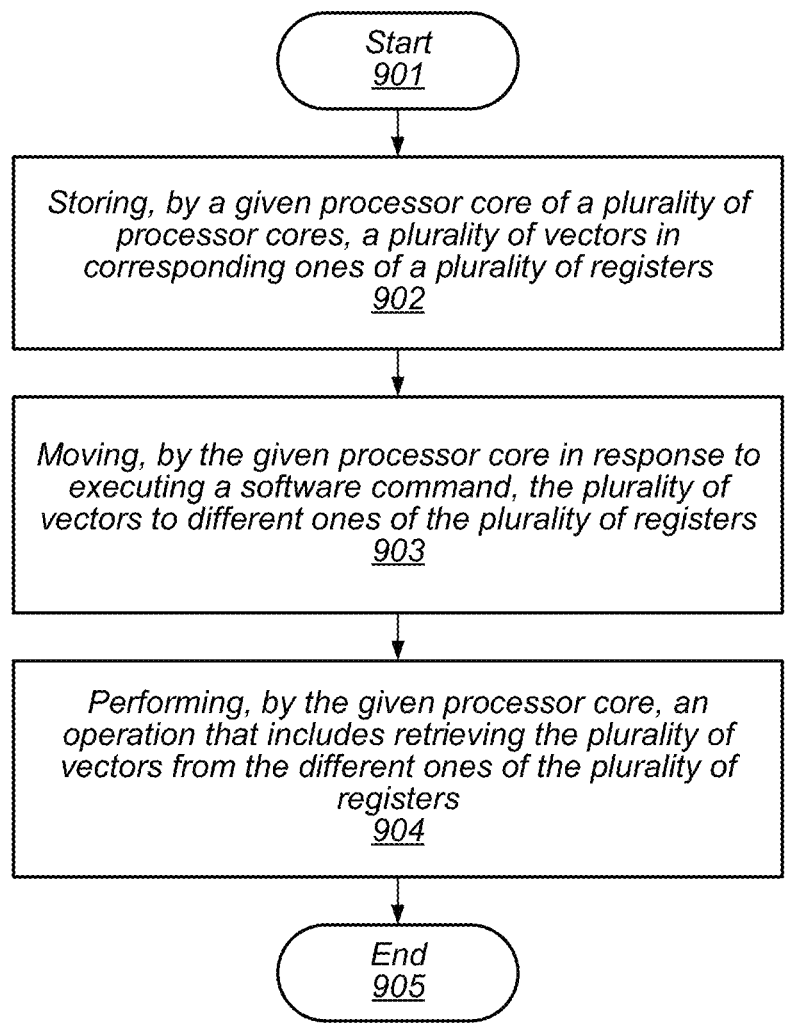
FIG. 9 is a flow diagram of an embodiment of a method for performing a shift operation.

As described above, the inclusion of an additional shift command in the instruction set of a processor or processor core, and the overhead associated with re-routing of information within an iterative decoding operation may be reduced. A flow diagram depicting an embodiment of a method for moving data within a storage circuit (e.g., storage circuit 101) is illustrated in FIG. 9. The method, which may be applied to various processor circuits such as processor circuit 102, begins in block 901.

The method includes storing, by a given processor core of a plurality of processor cores, a plurality of vectors in corresponding ones of a plurality of registers (block 902). In various embodiments, the plurality of vectors may correspond to intermediate values of an iterative decoding operation. In some cases, the intermediate values may be LLR values corresponding to a probability that information read from a memory circuit has a particular bit value.

In various embodiments, the plurality of registers may be included in a register file or other storage circuit (e.g., storage circuit 101). It is noted that, in some embodiments, the plurality of registers may include support circuitry that can be employed in moving data from one register to another.

The method also includes moving, by the given processor core in response to executing a software command, the plurality of vectors to different ones of the plurality of registers (block 903). In various embodiments, moving the plurality of vectors may include performing a shift operation on the plurality of vectors. Such a shift operation may be implemented by the given processor core retrieving data from a given register of the plurality of registers, and re-writing the information to a different register of the plurality of registers. In other cases, the given processor core may activate a signal that causes the plurality of registers to perform a shift operation.

In some cases, a processor or processor core accesses data in a register file using identifying information referred to as "register tags" (or simply "tags"). Tags encode information of where a particular vector is stored within the plurality of registers. In some embodiments, moving the plurality of vectors may include modifying a plurality of tags corresponding to the plurality of vectors. By modifying the tags corresponding to the plurality of vectors, the storage locations of a given vector will appear to have changed even though the actual location of the given vector remains the same. Using such a method can reduce power consumption by avoiding the movement of the data stored in the plurality of registers.

The method further includes performing, by the given processor core, an operation that includes retrieving the plurality of vectors from the different ones of the plurality of registers (block 904). In various embodiments, retrieving the plurality of vectors may include retrieving a plurality of tags corresponding to the plurality of vectors, and retrieving the plurality of vectors from the storage circuit using the plurality of tags. The method concludes in block 905.

Figure 10:
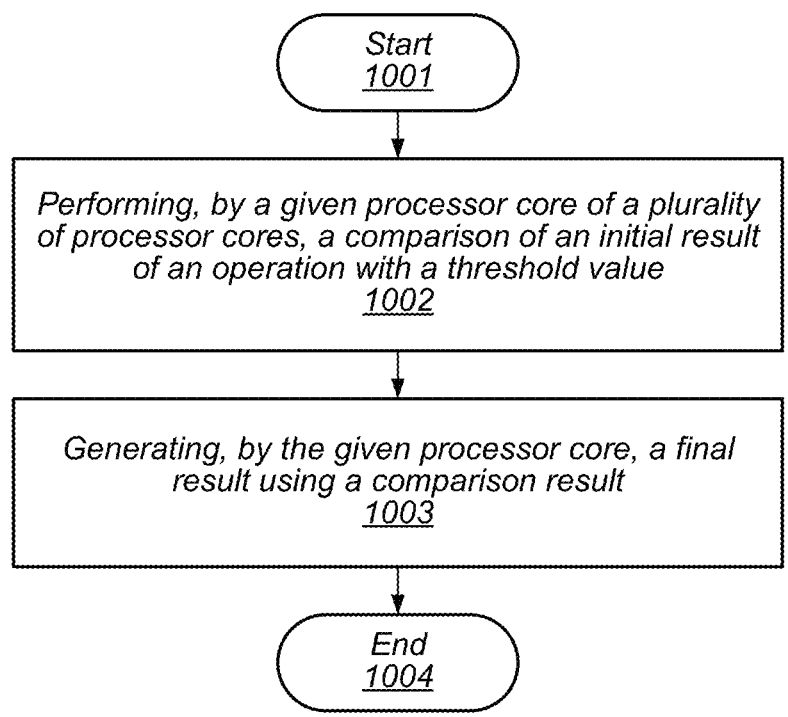
FIG. 10 is a flow diagram of an embodiment of a method for performing a saturation check operation.

When operations such as those described above are performed by a processor or processor core on fixed-point data, caution must be exercised to prevent overflows. A flow diagram of an embodiment of a method for performing a saturation check is illustrated in FIG. 10. The method, which may be applied to processor circuit 102, begins in block 1001.

The method includes performing, by a given processor core of a plurality of processor cores, a comparison of an initial result of an operation with a threshold value (block 1002). In various embodiments, the threshold value may be based on a maximum value that the given processor core can use. In some cases, the maximum value is determined by a number of bits (e.g., 64-bits) used to store data within the given processor core.

The method also includes generating, by the given processor core, a final result using a result of the comparison (block 1003). In various embodiments, generating the final result may include setting the final result to a minimum of the initial result and the threshold value. By limiting the value for the final result in this fashion, an overflow condition may be avoided. It is noted that the saturation check described above may be performed by a processor or processor core after each operation (or sub-operation with a given operation) included in an iterative decoding operation. The method concludes in block 1004.

Figure 11:
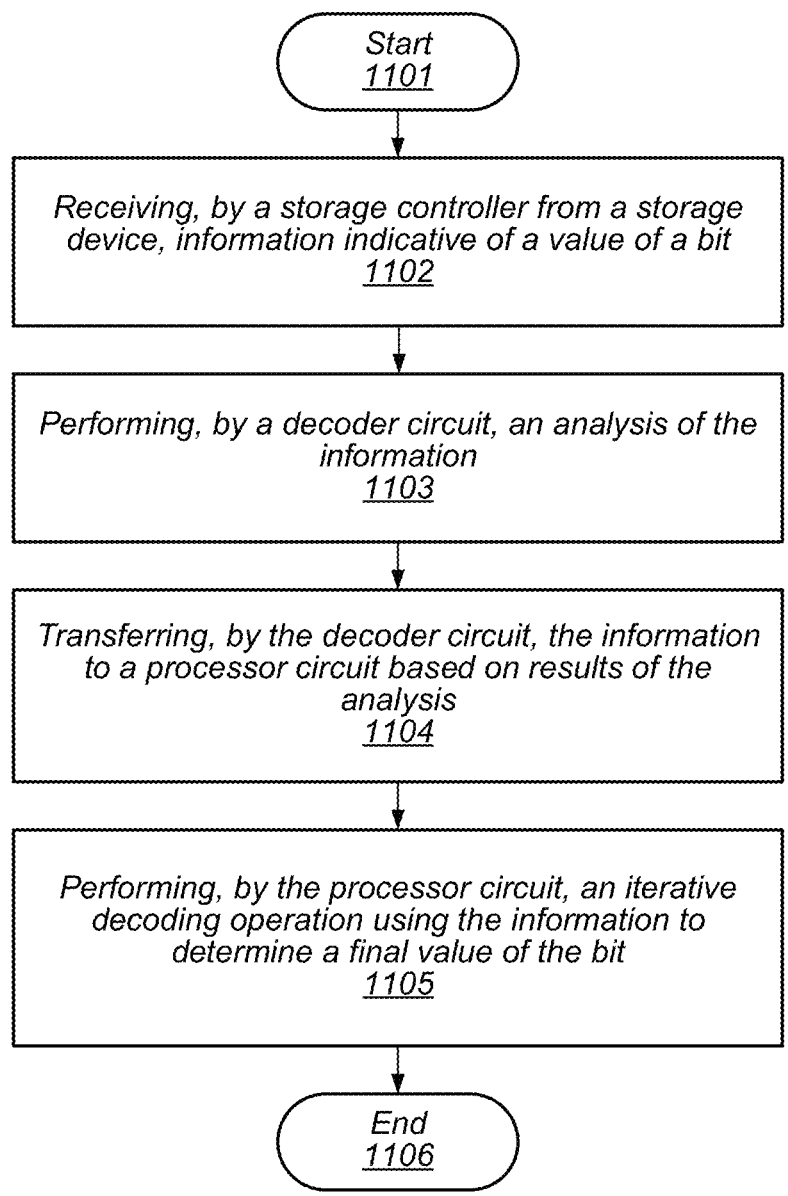
FIG. 11 is a flow diagram of an embodiment of a method for switching an iterative decoding process between a decoder circuit and a processor circuit.

As described above, a storage controller may include both a dedicated decoder circuit as well as one or more processor circuits. In some cases, the dedicated decoder circuit may be unable to complete a particular iterative decoding operation. Such failures may be the result of limitations with the decoder circuit, or a complexity with the data to be decoded, or a combination thereof. In such cases, one of the processor circuits may be used to perform the iterative decoding operation. Turning to FIG. 11, a flow diagram depicting an embodiment of a method for operating a storage controller is illustrated. The method, which may be applied to storage controller circuit 501, begins in block 1101.

The method includes receiving, by a storage controller from a storage device, information indicative of a value of a bit (block 1102). In various embodiments, the storage controller includes both a decoder circuit and one or more processor circuits, such as processor circuit 102. The storage device may, in various embodiments, include one or more memory circuits. In some cases, the information may include multiple bits that encode a logarithm of a likelihood that the bit has a particular value (e.g., a logical-1 value).

The method also includes performing, by a decoder or error correction circuit, an analysis of the information (block 1103). In various embodiments, the analysis may include performing an initial number of iterations of an iterative decoding operation. Based on intermediate results of the initial number of iterations, the decoder circuit can determine if it is capable of completing the iterative decoding process. In some cases, the analysis may include performing the iterative decoding operation until an error is detected.

The method further includes transferring, by the decoder circuit, the information to a processor circuit based on results of the analysis (block 1104). In various embodiments, the decoder circuit may transfer an original version of the information to the processor circuit in response to a determination that the iterative decoding process cannot be completed. Alternatively, a current state of the iterative decoding operation may be transferred to the processor circuit instead of, or in addition to, the original version of the information. In various embodiments, the current state may include intermediate values for corresponding nodes within the decoding operation.

The method also includes performing, by the processor circuit, an iterative decoding operation using the information to determine a final value of the bit (block 1105). In various embodiments, to perform the iterative decoding operation, the processor circuit may perform one or more of the operations (e.g., a shift operation) described above. The method concludes in block 1106.

Figure 12:
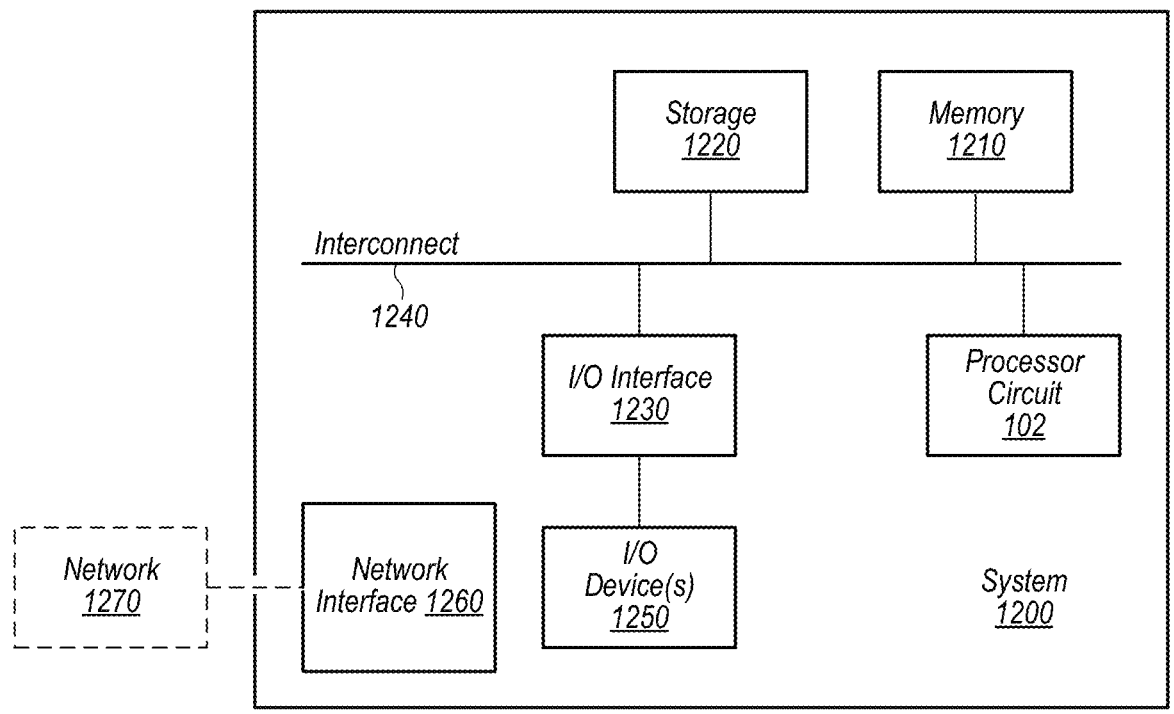
FIG. 12 is a block diagram of one embodiment of a computing device that includes a processor having an instruction storage circuit as described in the present disclosure.

Processor circuit 102 described above with reference to FIG. 1 may be included within a variety of system configurations, one example of which is shown in FIG. 12. In various embodiments, system 1200 may correspond to a general-purpose computer system, such as a desktop or portable computer, a mobile phone, or the like. System 1200 may also correspond to any type of embedded system that may employ one or more instances of processor circuit 102 as a dedicated controller. For example, system 1200 may correspond to any type of computer peripheral device such as a mass storage device or storage array, printer, or the like, as well as control systems for automobiles, aviation, manufacturing, and other suitable applications.

As shown, system 1200 includes processor circuit 1202, memory 1210, storage 1220, and an input/output (I/O) device interface 1230 coupled via an interconnect 1240. One or more I/O devices 1250 are coupled via I/O device interface 1230. System 1200 also includes a network interface 1260 that may be configured to couple system 1200 to a network 1270 for communications with, e.g., other systems. (In various embodiments, network interface 1260 may be coupled to interconnect 1240 directly, via I/O device interface 1230, or according to a different configuration.) It is noted that some or all of the components of system 1200 may be fabricated as a system-on-a-chip, although discrete combinations of components may also be employed.

Processor circuit 102 may include an instruction storage circuit as disclosed above. Memory 1210 may include random-access memory (RAM) of any suitable configuration, such as working memory configured to store data and instructions usable by processor circuit 102. Storage 1220 may include mass storage devices such as magnetic, optical, or nonvolatile/flash memory storage, or a combination of these. In some embodiments, either of memory 1210 or storage 1220 may be omitted or integrated into the other as a single memory subsystem from the perspective of processor circuit 102.

I/O device interface 1230 may be configured to interface between interconnect 1240 and one or more other types of buses or interfaces. For example, interconnect 1240 may correspond to the AHB interface discussed above (or another suitable type of high-bandwidth interconnect), and I/O device interface 1230 may be configured as a bridge device that enables coupling of different types of I/O devices to interconnect 1240. I/O device interface 1230 may implement one or more interface protocols such as Universal Serial Bus, Firewire, or other suitable standards. I/O device(s) 1250 may include any suitable type of storage, network interface, user interface, graphics processing, or other type of device. Network 1270, if present, may be any suitable type of wired or wireless communications network, such as an Internet Protocol (IP) addressed local or wide-area network, a telecommunications network, or the like. Network interface 1260, if present, may be configured to implement any suitable network interface protocol needed for communication with network 1270.

Figure 13:
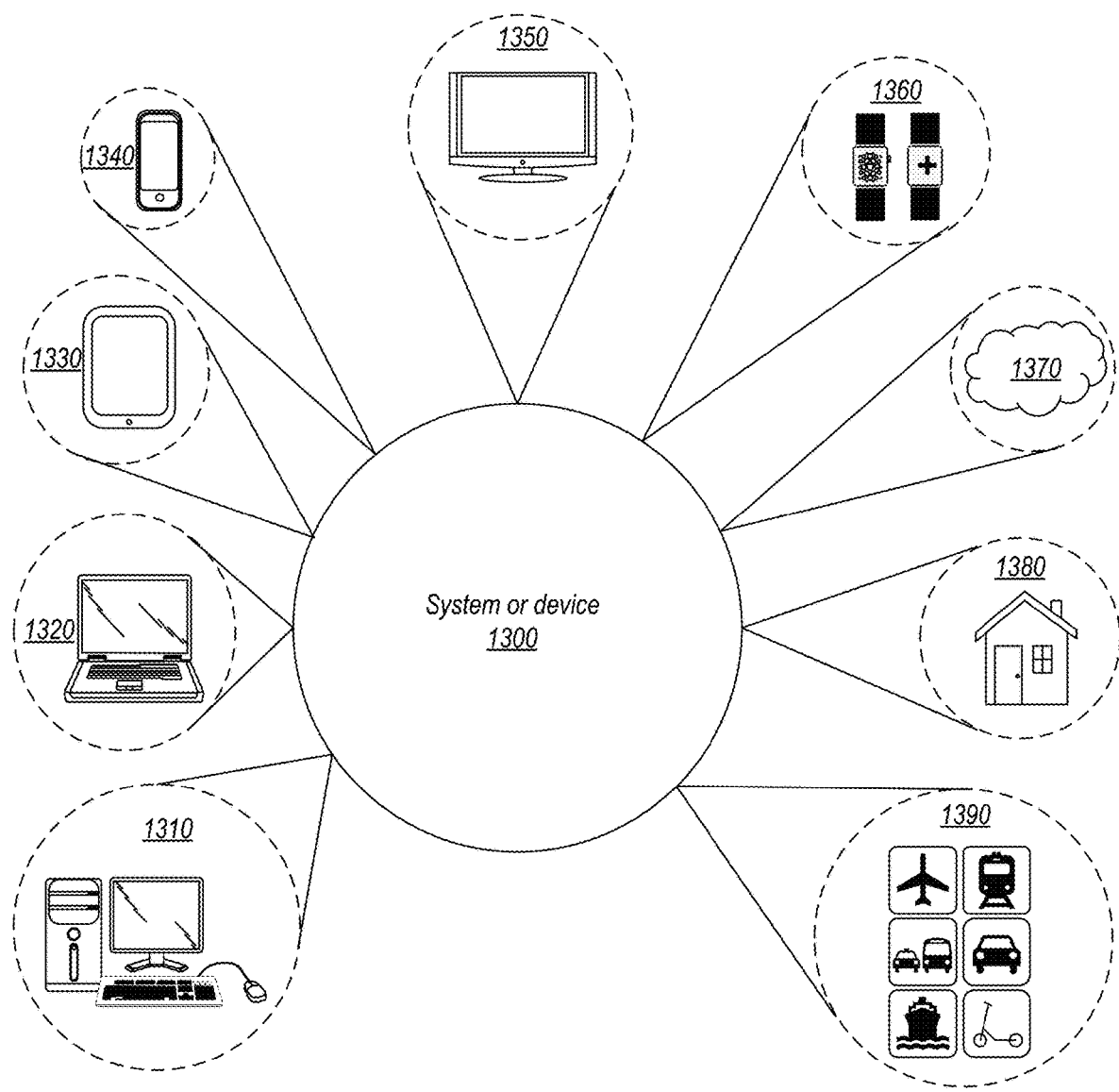
FIG. 13 is a block diagram of an embodiment of a system.

Turning now to FIG. 13, various types of systems that may include any of the circuits, devices, or systems discussed above are illustrated. System or device 1300, which may incorporate or otherwise utilize one or more of the techniques described herein, may be utilized in a wide range of areas. For example, system or device 1300 may be utilized as part of the hardware of systems such as a desktop computer 1310, laptop computer 1320, tablet computer 1330, cellular or mobile phone 1340, or television 1350 (or set-top box coupled to a television).

Similarly, disclosed elements may be utilized in a wearable device 1360, such as a smartwatch or a health-monitoring device. Smartwatches, in many embodiments, may implement a variety of different functions—for example, access to email, cellular service, calendar, health monitoring, etc. A wearable device may also be designed solely to perform health-monitoring functions such as monitoring a user's vital signs, performing epidemiological functions such as contact tracing, providing communication to an emergency medical service, etc. Other types of devices are also contemplated, including devices worn on the neck, devices implantable in the human body, glasses or a helmet designed to provide computer-generated reality experiences such as those based on augmented and/or virtual reality, etc.

System or device 1300 may also be used in various other contexts. For example, system or device 1300 may be utilized in the context of a server computer system, such as a dedicated server or on shared hardware that implements a cloud-based service 1370. Still further, system or device 1300 may be implemented in a wide range of specialized everyday devices, including devices 1380 commonly found in the home such as refrigerators, thermostats, security cameras, etc. The interconnection of such devices is often referred to as the "Internet of Things" (IoT). Elements may also be implemented in various modes of transportation. For example, system or device 1300 could be employed in the control systems, guidance systems, entertainment systems, etc. of various types of vehicles 1390.

The applications illustrated in FIG. 13 are merely exemplary and are not intended to limit the potential future applications of disclosed systems or devices. Other example applications include, without limitation: portable gaming devices, music players, data storage devices, unmanned aerial vehicles, etc.

\* \* \*

The present disclosure includes references to "an "embodiment" or groups of "embodiments" (e.g., "some embodiments" or "various embodiments"). Embodiments are different implementations or instances of the disclosed concepts. References to "an embodiment," "one embodiment," "a particular embodiment," and the like do not necessarily refer to the same embodiment. A large number of possible embodiments are contemplated, including those specifically disclosed, as well as modifications or alternatives that fall within the spirit or scope of the disclosure.

This disclosure may discuss potential advantages that may arise from the disclosed embodiments. Not all implementations of these embodiments will necessarily manifest any or all of the potential advantages. Whether an advantage is realized for a particular implementation depends on many factors, some of which are outside the scope of this disclosure. In fact, there are a number of reasons why an implementation that falls within the scope of the claims might not exhibit some or all of any disclosed advantages. For example, a particular implementation might include other circuitry outside the scope of the disclosure that, in conjunction with one of the disclosed embodiments, negates or diminishes one or more the disclosed advantages. Furthermore, suboptimal design execution of a particular implementation (e.g., implementation techniques or tools) could also negate or diminish disclosed advantages. Even assuming a skilled implementation, realization of advantages may still depend upon other factors such as the environmental circumstances in which the implementation is deployed. For example, inputs supplied to a particular implementation may prevent one or more problems addressed in this disclosure from arising on a particular occasion, with the result that the benefit of its solution may not be realized. Given the existence of possible factors external to this disclosure, it is expressly intended that any potential advantages described herein are not to be construed as claim limitations that must be met to demonstrate infringement. Rather, identification of such potential advantages is intended to illustrate the type(s) of improvement available to designers having the benefit of this disclosure. That such advantages are described permissively (e.g., stating that a particular advantage "may arise") is not intended to convey doubt about whether such advantages can in fact be realized, but rather to recognize the technical reality that realization of such advantages often depends on additional factors.

Unless stated otherwise, embodiments are non-limiting. That is, the disclosed embodiments are not intended to limit the scope of claims that are drafted based on this disclosure, even where only a single example is described with respect to a particular feature. The disclosed embodiments are intended to be illustrative rather than restrictive, absent any statements in the disclosure to the contrary. The application is thus intended to permit claims covering disclosed embodiments, as well as such alternatives, modifications, and equivalents that would be apparent to a person skilled in the art having the benefit of this disclosure.

For example, features in this application may be combined in any suitable manner. Accordingly, new claims may be formulated during prosecution of this application (or an application claiming priority thereto) to any such combination of features. In particular, with reference to the appended claims, features from dependent claims may be combined with those of other dependent claims where appropriate, including claims that depend from other independent claims. Similarly, features from respective independent claims may be combined where appropriate.

Accordingly, while the appended dependent claims may be drafted such that each depends on a single other claim, additional dependencies are also contemplated. Any combinations of features in the dependent claims that are consistent with this disclosure are contemplated and may be claimed in this or another application. In short, combinations are not limited to those specifically enumerated in the appended claims.

Where appropriate, it is also contemplated that claims drafted in one format or statutory type (e.g., apparatus) are intended to support corresponding claims of another format or statutory type (e.g., method).

\* \* \*

Because this disclosure is a legal document, various terms and phrases may be subject to administrative and judicial interpretation. Public notice is hereby given that the following paragraphs, as well as definitions provided throughout the disclosure, are to be used in determining how to interpret claims that are drafted based on this disclosure.

References to a singular form of an item (i.e., a noun or noun phrase preceded by "a," "an," or "the") are, unless context clearly dictates otherwise, intended to mean "one or more." Reference to "an item" in a claim thus does not, without accompanying context, preclude additional instances of the item. A "plurality" of items refers to a set of two or more of the items.

The word "may" is used herein in a permissive sense (i.e., having the potential to, being able to) and not in a mandatory sense (i.e., must).

The terms "comprising" and "including," and forms thereof, are open-ended and mean "including, but not limited to."

When the term "or" is used in this disclosure with respect to a list of options, it will generally be understood to be used in the inclusive sense unless the context provides otherwise. Thus, a recitation of "x or y" is equivalent to "x or y, or both," and thus covers 1) x but not y, 2) y but not x, and 3) both x and y. On the other hand, a phrase such as "either x or y, but not both" makes clear that "or" is being used in the exclusive sense.

A recitation of "w, x, y, or z, or any combination thereof" or "at least one of . . . w, x, y, and z" is intended to cover all possibilities involving a single element up to the total number of elements in the set. For example, given the set [w, x, y, z], these phrasings cover any single element of the set (e.g., w but not x, y, or z), any two elements (e.g., w and x, but not y or z), any three elements (e.g., w, x, and y, but not z), and all four elements. The phrase "at least one of . . . w, x, y, and z" thus refers to at least one element of the set [w, x, y, z], thereby covering all possible combinations in this list of elements. This phrase is not to be interpreted to require that there is at least one instance of w, at least one instance of x, at least one instance of y, and at least one instance of z.

Various "labels" may precede nouns or noun phrases in this disclosure. Unless context provides otherwise, different labels used for a feature (e.g., "first circuit," "second circuit," "particular circuit," "given circuit," etc.) refer to different instances of the feature. Additionally, the labels "first," "second," and "third" when applied to a feature do not imply any type of ordering (e.g., spatial, temporal, logical, etc.), unless stated otherwise.

The phrase "based on" is used to describe one or more factors that affect a determination. This term does not foreclose the possibility that additional factors may affect the determination. That is, a determination may be solely based on specified factors or based on the specified factors as well as other, unspecified factors. Consider the phrase "determine A based on B." This phrase specifies that B is a factor that is used to determine A or that affects the determination of A. This phrase does not foreclose that the determination of A may also be based on some other factor, such as C. This phrase is also intended to cover an embodiment in which A is determined based solely on B. As used herein, the phrase "based on" is synonymous with the phrase "based at least in part on."

The phrases "in response to" and "responsive to" describe one or more factors that trigger an effect. This phrase does not foreclose the possibility that additional factors may affect or otherwise trigger the effect, either jointly with the specified factors or independent from the specified factors. That is, an effect may be solely in response to those factors, or may be in response to the specified factors as well as other, unspecified factors. Consider the phrase "perform A in response to B." This phrase specifies that B is a factor that triggers the performance of A, or that triggers a particular result for A. This phrase does not foreclose that performing A may also be in response to some other factor, such as C. This phrase also does not foreclose that performing A may be jointly in response to B and C. This phrase is also intended to cover an embodiment in which A is performed solely in response to B. As used herein, the phrase "responsive to" is synonymous with the phrase "responsive at least in part to." Similarly, the phrase "in response to" is synonymous with the phrase "at least in part in response to."

\* \* \*

Within this disclosure, different entities (which may variously be referred to as "units," "circuits," other components, etc.) may be described or claimed as "configured" to perform one or more tasks or operations. This formulation—[entity] configured to [perform one or more tasks]—is used herein to refer to structure (i.e., something physical). More specifically, this formulation is used to indicate that this structure is arranged to perform the one or more tasks during operation. A structure can be said to be "configured to" perform some task even if the structure is not currently being operated. Thus, an entity described or recited as being "configured to" perform some task refers to something physical, such as a device, circuit, a system having a processor unit and a memory storing program instructions executable to implement the task, etc. This phrase is not used herein to refer to something intangible.

In some cases, various units/circuits/components may be described herein as performing a set of task or operations. It is understood that those entities are "configured to" perform those tasks/operations, even if not specifically noted.

The term "configured to" is not intended to mean "configurable to." An unprogrammed FPGA, for example, would not be considered to be "configured to" perform a particular function. This unprogrammed FPGA may be "configurable to" perform that function, however. After appropriate programming, the FPGA may then be said to be "configured to" perform the particular function.

For purposes of United States patent applications based on this disclosure, reciting in a claim that a structure is "configured to" perform one or more tasks is expressly intended not to invoke 35 U.S.C. § 112(f) for that claim element. Should Applicant wish to invoke Section 112(f) during prosecution of a United States patent application based on this disclosure, it will recite claim elements using the "means for" [performing a function] construct.

Different "circuits" may be described in this disclosure. These circuits or "circuitry" constitute hardware that includes various types of circuit elements, such as combinatorial logic, clocked storage devices (e.g., flip-flops, registers, latches, etc.), finite state machines, memory (e.g., random-access memory, embedded dynamic random-access memory), programmable logic arrays, and so on. Circuitry may be custom designed, or taken from standard libraries. In various implementations, circuitry can, as appropriate, include digital components, analog components, or a combination of both. Certain types of circuits may be commonly referred to as "units" (e.g., a decode unit, an arithmetic logic unit (ALU), functional unit, memory management unit (MMU), etc.). Such units also refer to circuits or circuitry.

The disclosed circuits/units/components and other elements illustrated in the drawings and described herein thus include hardware elements such as those described in the preceding paragraph. In many instances, the internal arrangement of hardware elements within a particular circuit may be specified by describing the function of that circuit. For example, a particular "decode unit" may be described as performing the function of "processing an opcode of an instruction and routing that instruction to one or more of a plurality of functional units," which means that the decode unit is "configured to" perform this function. This specification of function is sufficient, to those skilled in the computer arts, to connote a set of possible structures for the circuit.

In various embodiments, as discussed in the preceding paragraph, circuits, units, and other elements are defined by the functions or operations that they are configured to implement. The arrangement of such circuits/units/components with respect to each other and the manner in which they interact, form a microarchitectural definition of the hardware that is ultimately manufactured in an integrated circuit or programmed into an FPGA to form a physical implementation of the microarchitectural definition. Thus, the microarchitectural definition is recognized by those of skill in the art as structure from which many physical implementations may be derived, all of which fall into the broader structure described by the microarchitectural definition. That is, a skilled artisan presented with the microarchitectural definition supplied in accordance with this disclosure may, without undue experimentation and with the application of ordinary skill, implement the structure by coding the description of the circuits/units/components in a hardware description language (HDL) such as Verilog or VHDL. The HDL description is often expressed in a fashion that may appear to be functional. But to those of skill in the art in this field, this HDL description is the manner that is used transform the structure of a circuit, unit, or component to the next level of implementational detail. Such an HDL description may take the form of behavioral code (which is typically not synthesizable), register transfer language (RTL) code (which, in contrast to behavioral code, is typically synthesizable), or structural code (e.g., a netlist specifying logic gates and their connectivity). The HDL description may subsequently be synthesized against a library of cells designed for a given integrated circuit fabrication technology, and may be modified for timing, power, and other reasons to result in a final design database that is transmitted to a foundry to generate masks and ultimately produce the integrated circuit. Some hardware circuits or portions thereof may also be custom-designed in a schematic editor and captured into the integrated circuit design along with synthesized circuitry. The integrated circuits may include transistors and other circuit elements (e.g. passive elements such as capacitors, resistors, inductors, etc.) and interconnect between the transistors and circuit elements. Some embodiments may implement multiple integrated circuits coupled together to implement the hardware circuits, and/or discrete elements that may be used in some embodiments. Alternatively, the HDL design may be synthesized to a programmable logic array such as a field programmable gate array (FPGA) and may be implemented in the FPGA. This decoupling between the design of a group of circuits and the subsequent low-level implementation of these circuits commonly results in a scenario in which the circuit or logic designer never specifies a particular set of structures for the low-level implementation beyond a description of what the circuit is configured to do, as this process is performed at a different stage of the circuit implementation process.

The fact that many different low-level combinations of circuit elements may be used to implement the same specification of a circuit results in a large number of equivalent structures for that circuit. As noted, these low-level circuit implementations may vary according to changes in the fabrication technology, the foundry selected to manufacture the integrated circuit, the library of cells provided for a particular project, etc. In many cases, the choices made by different design tools or methodologies to produce these different implementations may be arbitrary.

Moreover, it is common for a single implementation of a particular functional specification of a circuit to include, for a given embodiment, a large number of devices (e.g., millions of transistors). Accordingly, the sheer volume of this information makes it impractical to provide a full recitation of the low-level structure used to implement a single embodiment, let alone the vast array of equivalent possible implementations. For this reason, the present disclosure describes structure of circuits using the functional shorthand commonly employed in the industry.

What is claimed is:

1. An apparatus, comprising:
    a storage circuit configured to store a plurality of vectors associated with an iterative decoding operation; and
    one or more processor cores, wherein a given processor core of the processor cores is configured to:
        retrieve a subset of the plurality of vectors that includes a first intermediate value vector, a first estimation vector, a second estimation vector, and a sign vector;
        determine an absolute value of the first intermediate value vector;
        generate an updated value for the first estimation vector using the absolute value of the first intermediate value vector;
        generate an updated value for the second estimation vector using the absolute value of the first intermediate value vector, the updated value of the first estimation vector, and a current value of the second estimation vector; and
        generate an updated value for the sign vector of the plurality of vectors using a current value of the sign vector and a sign of the first intermediate value vector.

2. The apparatus of claim 1, wherein to generate the updated value for the first estimation vector, the given processor core is further configured to:
    determine a difference between the absolute value of the first intermediate value vector and the updated value for the first estimation vector;
    determine a product of the difference and a coefficient; and
    generate a corrected value for the first estimation vector using the updated value of the first estimation vector and the product.

3. The apparatus of claim 1, wherein to generate the updated value for the first estimation vector, the given processor core is further configured to generate a corrected value for the first estimation vector using a coefficient and the updated value of the first estimation vector.

4. The apparatus of claim 1, wherein the given processor core is further configured to:
  determine an absolute value of a second intermediate value vector of the plurality of vectors; and
  generate, in parallel to a generation of the updated value for the first estimation vector, an updated value for a third estimation vector of the plurality of vectors using a current value of the third estimation vector and the absolute value of the second intermediate value vector.

5. The apparatus of claim 1, wherein the first intermediate value vector is included in a plurality of intermediate vectors stored in a corresponding one of a plurality of registers included in the storage circuit, and wherein the given processor core is further configured to:
  change respective registers in which the plurality of intermediate vectors are stored; and
  retrieve the first intermediate value vector from its new storage location prior to a determination of the absolute value of the first intermediate value vector.

6. The apparatus of claim 1, wherein to generate the updated value for the first estimation vector, the given processor core is further configured to:
  perform a comparison of the updated value for the first estimation vector to a threshold value; and
  adjust the updated value for the first estimation vector using results of the comparison.

7. A method, comprising:
  receiving, by a given processor core of a plurality of processor cores, a first intermediate value vector, a first estimation vector, a second estimation vector, and a sign vector;
  determining, by the given processor core, an absolute value of the first intermediate value vector;
  generating, by the given processor core, an updated value for the first estimation vector with a minimum of a current value of the first estimation vector and the absolute value of the first intermediate value vector;
  generating, by the given processor core, an updated value for the second estimation vector with a minimum of the updated value of the first estimation vector, the absolute value of the first intermediate value vector, and a current value of the second estimation vector; and
  generating, by the given processor core, an updated value for the sign vector using a current value of the sign vector and a sign of the first intermediate value vector.

8. The method of claim 7, wherein generating the updated value for the first estimation vector includes:
  determining, by the given processor core, a difference between the absolute value of the first intermediate value vector and the updated value for the first estimation vector;
  determining, by the given processor core, a product of the difference and a coefficient; and
  generating, by the given processor core, a corrected value for the first estimation vector using the updated value of the first estimation vector and the product.

9. The method of claim 7, wherein generating the updated value for the first estimation vector includes generating, by the given processor core, a corrected value for the first estimation vector using a coefficient and the updated value of the first estimation vector.

10. The method of claim 7, further comprising:
  receiving a second intermediate value vector, a third estimation vector, a fourth estimation vector, and a second sign vector;
  determining a second absolute value of the second intermediate value vector; and
  generating, in parallel to generating the updated value for the first estimation vector, an updated value for the third estimation vector with a second minimum of a current value of the third estimation vector and the second absolute value of the second intermediate value vector.

11. The method of claim 7, wherein the first intermediate value vector is included in a plurality of intermediate value vectors stored in corresponding ones of a plurality of registers, and wherein the method further includes:
  changing respective registers in which the plurality of intermediate value vectors are stored; and
  retrieving, by the given processor core, the first intermediate value vector from its new storage location prior to a determination of the absolute value of the first intermediate value vector.

12. The method of claim 7, wherein generating the updated value for the first estimation vector includes:
  performing, by the given processor core, a comparison of the updated value for the first estimation vector to a threshold value; and
  adjusting, by the given processor core, the updated value for the first estimation vector using results of the comparison.

13. The method of claim 12, wherein adjusting the updated value of the first estimation vector includes selecting a minimum value of the updated value for the first estimation vector and the threshold value.

* * * * *